(12) United States Patent
Coimbra et al.

(10) Patent No.: US 8,890,612 B2
(45) Date of Patent: Nov. 18, 2014

(54) DYNAMICALLY BIASED OUTPUT STRUCTURE

(71) Applicant: Freescale Semiconductor, Inc., Austin, TX (US)

(72) Inventors: Ricardo Pureza Coimbra, Campinas (BR); Edevaldo Pereira da Silva, Jr., Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 154 days.

(21) Appl. No.: 13/656,253

(22) Filed: Oct. 19, 2012

(65) Prior Publication Data

US 2014/0111278 A1 Apr. 24, 2014

(51) Int. Cl.
*H03F 3/45* (2006.01)

(52) U.S. Cl.
CPC ......................................... *H03F 3/45* (2013.01)
USPC .......................................... 330/259; 330/253

(58) Field of Classification Search
CPC ....................................................... H03F 3/45
USPC ................................................. 330/253–261
See application file for complete search history.

(56) References Cited

U.S. PATENT DOCUMENTS

| | | | |
|---|---|---|---|
| 6,437,645 B1 | 8/2002 | Ivanov et al. | |
| 6,642,791 B1 * | 11/2003 | Balan | ............................ 330/253 |
| 7,176,760 B2 | 2/2007 | Jones | |
| 7,342,450 B2 | 3/2008 | Jones | |
| 7,622,990 B2 | 11/2009 | Rysinski et al. | |
| 7,834,693 B2 | 11/2010 | Lee et al. | |
| 7,884,671 B2 | 2/2011 | Chung | |
| 2012/0133422 A1 | 5/2012 | Pereira da Silva, Jr. et al. | |

OTHER PUBLICATIONS

Callewaert et al., "Class AB CMOS Amplifiers with High Efficiency", IEEE Journal of Solid-State Circuits, Jun. 1990, vol. 25, No. 3, pp. 684-691, IEEE, US.
Harjani, et al., "An Integrated Low-Voltage Class AB CMOS OTA", IEEE Journal of Solid-State Circuits, Feb. 1999, vol. 34, No. 2, pp. 134-142, IEEE, US.
Hogervorst, et al., "A Compact Power-Efficient 3 V CMOS Rail-to-Rail Input/Output Operational Amplifier for VLSI Cell Libraries", IEEE Journal of Solid-State Circuits, Dec. 1994, vol. 29, No. 12, pp. 1505-1513, IEEE, US.
Le et al., "Compact Low-Power High-Slew-Rate Buffer for LCD Driver Applications", Electronics Letters, Sep. 30, 2010, vol. 46, No. 20, Institution of Engineering and Technology (IET), UK.

* cited by examiner

*Primary Examiner* — Robert Pascal
*Assistant Examiner* — Khiem Nguyen

(57) ABSTRACT

A transconductance amplification stage (301) includes a differential pair (306) wherein a bias current flows through each transistor (302, 304) of the pair when input voltages are equal. Tail current boosting circuitry (320), which includes a tail transistor, provides a translinear expansion of tail current of the differential pair. A feedback loop (307) dynamically biases the differential pair to maintain current through one transistor (302) of the pair at the bias current value in spite of a difference between input voltages. Another transistor (304) of the pair provides an output current responsive to a difference between input voltages. The output current is not affected by a region of operation of the tail transistor. An output structure (300, 500) includes the transconductance amplification stage and a circuit (303) for mirroring the output current. An amplifier (800) includes the output structure as a buffer between other structures (801) and an output terminal.

20 Claims, 8 Drawing Sheets

DYNAMICALLY BIASED OUTPUT STRUCTURE

BACKGROUND

1. Field

This invention relates generally to amplifiers, and more specifically to an output structure of an amplifier.

2. Related Art

The input of some circuits may appear very capacitive to an output structure that is driving the circuit. The input impedance of such circuits decreases as the frequency of a signal driving such circuit increases. As the frequency of the signal driving such circuit increases, a current consumed by some known output structures increases. Some known output structures disadvantageously consume a large amount of current regardless of the driving frequency.

Many known output structures include a differential pair gain stage or another type of class-A gain stage. The greatest amount of current that a differential pair of transistors (hereinafter "differential pair") can deliver to a circuit being driven by the output structure is the amount of current used to bias the transistors of the differential pair. Therefore, in some known output structures, when the circuit being driven has a high input capacitance, a tail current of the differential pair must be large at all times, thereby disadvantageously constantly consuming much current.

With a conventional differential pair, a maximum transient current through either input transistor is equal to a magnitude of the fixed tail current. The fixed tail current imposes a slew rate limitation when the differential pair is subjected to large-signal transient input signals. Known output structures of low-power CMOS amplifiers have large-signal response time limited by slew rate. Slew rate of an amplifier is a measure of how rapidly an amplifier can charge/discharge a capacitance that is coupled to an output terminal of the amplifier in response to a rapid large-signal increase/decrease of an input signal of the amplifier. Slew rate of an amplifier is approximately equal to a fixed bias current divided by a capacitance of an input impedance of a circuit being driven by the amplifier. A large signal frequency response of an amplifier depends on the slew rate.

A differential voltage at an input of a class AB amplifier is converted into an output current. A class AB amplifier needs to provide a larger current at its output when reacting to large signal disturbances than when reacting to small disturbances or during steady state.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
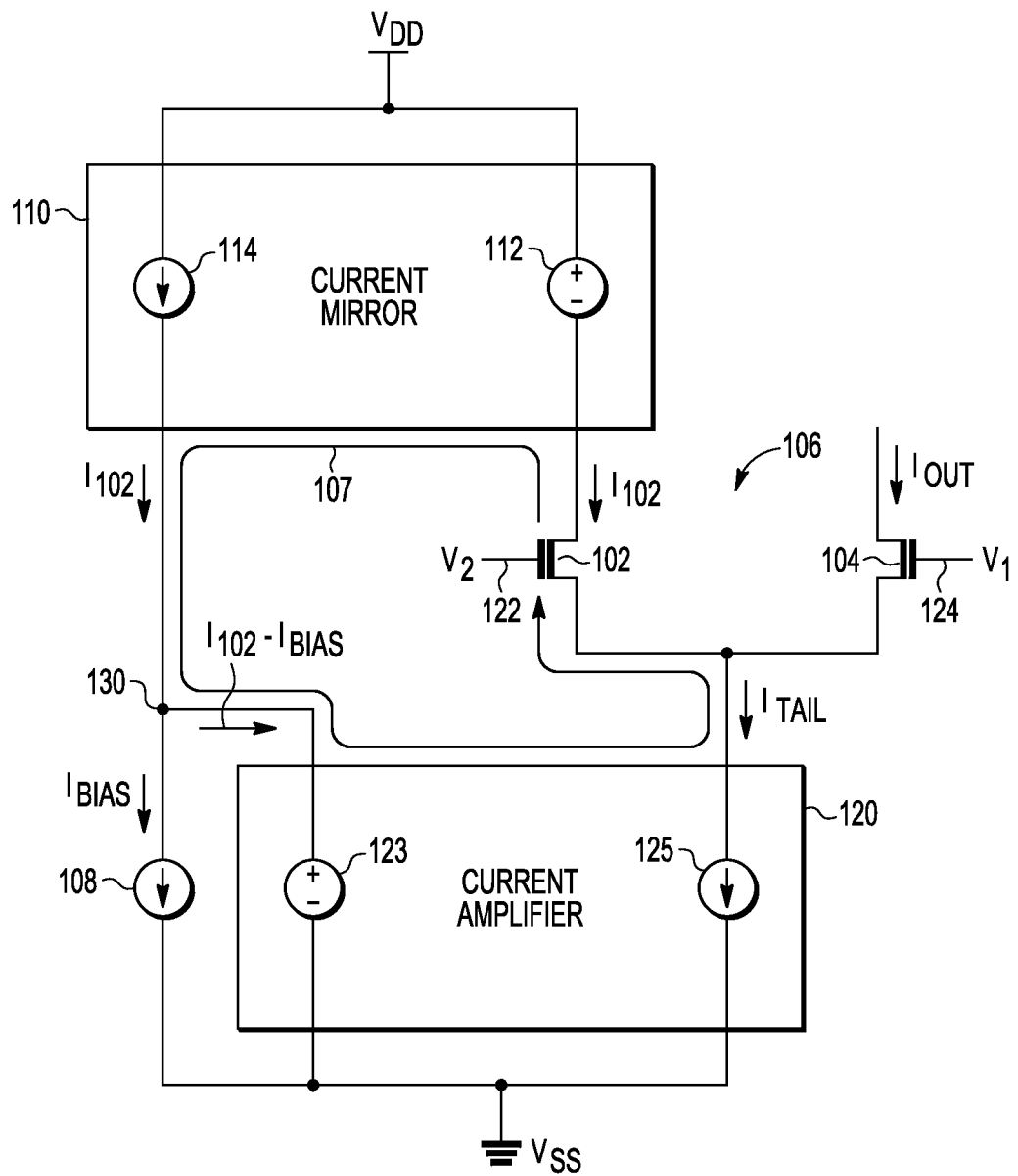
FIG. 1 is a combination functional block diagram and schematic including a differential pair of an amplification stage, of a dynamically biased output structure in accordance with one embodiment of the invention.

FIG. 1 is a schematic and functional block diagram of a translinear transconductance amplification stage (hereinafter "amplification stage") 100 of a dynamically biased output structure (hereinafter "output structure") of an amplifier, in accordance with one embodiment of the invention. "Translinear" means that a magnitude of a slope of the transfer function of the amplification stage 100 increases with increasing input magnitude. The amplification stage 100 reduces the slew rate limitation of output settling time for an output structure such as output structure 300 and 500 (see FIGS. 3 and 5). The amplification stage 100 provides tail current boosting during large input signal transients, which allows for fast response with no impact on steady-state power consumption.

The amplification stage 100 includes a differential pair 106 that provides gain, and a feedback loop 107 that dynamically controls a tail current $I_{TAIL}$ of the differential pair to achieve an expansion of an output current of an output structure such as output structure 300 and 500. The differential pair 106 includes a left input transistor 102 and a right input transistor 104. A current source 108 provides a fixed current $I_{BIAS}$ that defines an operating bias point of the differential pair 106. The amplification stage 100 also includes a current mirror 110 and a current amplifier 120. Inputs 122 and 124 of the amplification stage 100 are a voltage $V_2$ that is fed into a gate of the left input transistor 102 and a voltage $V_1$ that is fed into a gate of the right input transistor 104, respectively. An output current $I_{OUT}$ of the amplification stage 100 is a drain current of the right input transistor 104.

The current mirror 110 is represented by a voltage source 112 and a current source 114. The voltage source 112 monitors a drain current $I_{102}$ of the left input transistor 102, and replicates this current at the current source 114. The current minor 110 feeds a current, which is equal in magnitude to the drain current $I_{102}$ of the left input transistor 102, into a node 130 to which the current source 108 is also connected.

The current amplifier 120 is represented by a voltage source 123 and a current source 125. A variable $I_{102}$ current from the current minor 110 minus the fixed current $I_{BIAS}$ from the current source 108 equals a current through the voltage source 123 of the current amplifier 120. The current amplifier 120 inversely amplifies a current through voltage source 123. For example, a decrease in the current through voltage source 123 results in an increase in the current of the current source 125 by an amplified amount. During steady-state, i.e., when $V_1=V_2$, the current through voltage source 123 tends to zero because under such condition, $I_{102}-I_{BIAS}\approx0$. During steady-state, $I_{TAIL}=2I_{BIAS}=(I_{102}-I_{BIAS})\times$open loop gain of the feedback loop 107. Because the open loop gain is very large, e.g., "1000" or greater, the quantity $(I_{102}-I_{BIAS})$ tends to zero but is not exactly zero. Therefore, $I_{102}$ will never be exactly equal to $I_{BIAS}$ and consequently $I_{TAIL}$ is never zero. This also applies when $V_1$ is different from $V_2$. If the feedback loop 107 is stable, it can be considered that $I_{102} \approx I_{BIAS}$ even when $I_{TAIL}$ is much higher than $2I_{BIAS}$.

During large input voltage transitions at the gate of the left input transistor 102, the current through voltage source 123 may tend to change. Depending on the current through voltage source 123, the current of the current source 125 may become greater than $2I_{BIAS}$. The current of the current source 125 provides a tail current $I_{TAIL}$ of the differential pair 106. Therefore, advantageously, the tail current $I_{TAIL}$ may be greater than $2I_{BIAS}$. As a result of the feedback loop 107, the drain current of the left input transistor 102 remains at a value equal to $I_{BIAS}$ regardless of the value of the voltage at the gate of the left input transistor. Whenever $I_{TAIL}$ increases to a value greater than $2I_{BIAS}$, the amount of $I_{TAIL}$ that is greater than $2I_{BIAS}$ flows through the right input transistor 104 while only the $I_{BIAS}$ current flows through the left input transistor 102. The current amplifier 120 scales the tail current $I_{TAIL}$ in proportion to a current needed at the output of an output structure, such as output structure 300 and 500. It should be appreciated that the current amplifier 120 acts as a tail current boosting circuitry in conjunction with the other elements of the amplification stage 100.

The amplification stage 100 employs a dynamic current control technique. The amplification stage 100 implements the feedback loop 107 that dynamically controls a biasing current of the left input transistor 102 of the differential pair 106. The feedback loop 107 maintains, by negative feedback, the drain current of the left input transistor 102 equal to $I_{BIAS}$ by adjusting the tail current of the differential pair 106. This means that $V_{GS}$ of the left input transistor 102 is maintained at a value that produces $I_{BIAS}$ regardless of a value of a voltage at the gate of the left input transistor. Therefore, the feedback loop 107 forces any voltage change at the gate of the left input transistor 102 to appear at the source terminals of the input transistors 102 and 104 shifted by a fixed $V_{GS}$ voltage amount. This ultimately forces almost all of the input differential voltage $V_1-V_2$ to be applied as a gate-to-source voltage $V_{GS}$ at the right input transistor 104 which results in an increase of the output current $I_{OUT}$ (sunk as tail current) due to the trans-linear transconductance of the right input transistor. For example, when the right input transistor 104 is in weak inversion, the current through each transistor of the differential pair 106 has an exponential relationship with the voltage at the gate of each transistor. For example, when the right input transistor 104 is in strong inversion, the current through each transistor of the differential pair 106 has a quadratic relationship with the voltage at the gate of each transistor. An increase of current in the right transistor input 104, which is not limited by any fixed tail current source, can be mirrored to an output stage of an output structure, such as output structure 300 and 500, thereby providing high drive capability during large signal transients. The feedback loop 107 permits generation of a high transient output current, which can be many times larger than a steady-state quiescent output current. As a result, slew rate is increased and the output structure has a fast large-signal response with low distortion.

With one known amplification stage, if $I_{TAIL}=2$ μA and if $V_1$ becomes higher than $V_2$, i.e., if $V_1-V_2$ becomes larger, then the drain current of one input transistor goes lower and the drain current of the other input transistor goes higher. With such known amplification stage, if $V_1$ becomes much higher than $V_2$, i.e., if $V_1-V_2$ becomes very large, the drain current of one input transistor goes to almost 0 μA and the drain current of the other input transistor goes to almost 2 μA. However, disadvantageously, the drain current of neither input transistor of the one known amplification stage is able to go higher than 2 μA.

Figure 2:
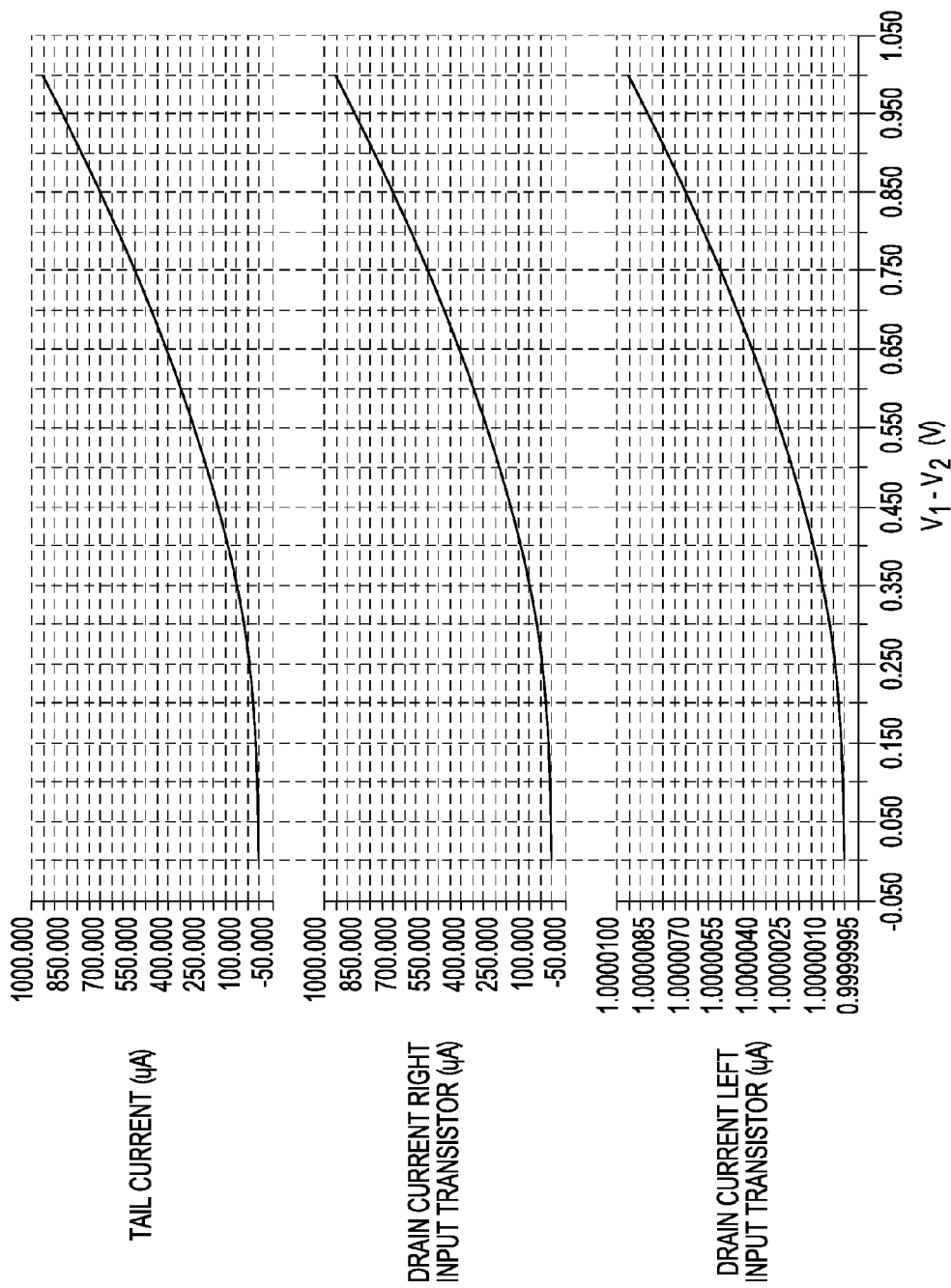
FIG. 2 illustrates graphs of a drain current of each transistor of the differential pair and a tail current of the differential pair of the amplification stage shown in FIG. 1.

In contrast to the one known amplification stage described above, FIG. 2 illustrates graphs of a drain current of input transistor 102, a drain current of input transistor 104 and a tail current of the differential pair 106, versus $V_1-V_2$ for one embodiment of the amplification stage 100. In the one embodiment of the amplification stage 100, when $V_1=V_2$, i.e., when $V_1-V_2=0$, the drain current of input transistor 102 is 1 μA, the drain current of input transistor 104 is 1 μA and $I_{TAIL}$ is 2 μA. With the amplification stage 100, as $V_1$ becomes higher than $V_2$, i.e., as $V_1-V_2$ becomes larger, the drain current of input transistor 102 remains near 1 μA, and the drain current of input transistor 104 goes higher in a transconductance relationship with increasing $V_1-V_2$. FIG. 2 shows that the drain current of input transistor 104 advantageously can go much higher than $I_{BIAS}=2$ μA because $I_{TAIL}$ can go much higher than 2 μA.

Figure 3:
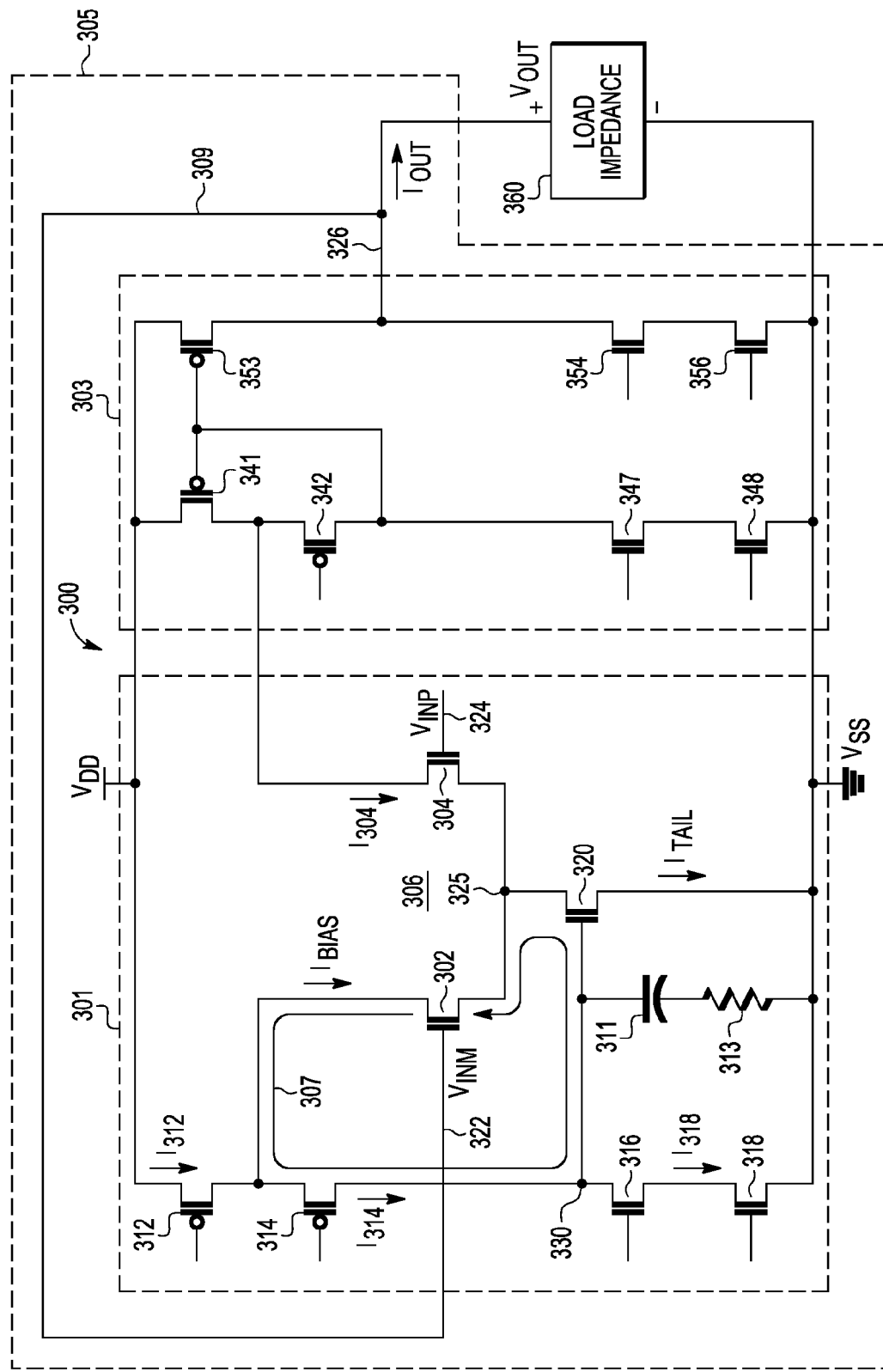
FIG. 3 is a schematic of a dynamically biased output structure in accordance with an embodiment of the invention, and an input impedance of a circuit that may be driven by the dynamically biased output structure.

FIG. 3 is a schematic of the dynamically biased output structure 300 in accordance with an embodiment of the invention, and an input impedance 360 of a circuit that may be driven by the biased output structure. The output structure 300 reduces the slew rate limitation of output settling time for a low-power CMOS amplifier. The output structure 300 is particularly suited for driving a load whose input impedance 360 includes a large capacitance $C_{LOAD}$, while maintaining a good response bandwidth for both small and large signal input variations. The output structure 300 provides control of a tail current of a differential pair so that the tail current can rise far above steady-state values during input voltage transients. By steady-state, it is meant that a difference between the input voltages is zero. The output structure 300 is able to drive large output currents when reacting to large input-signal disturbances, while preserving low-power operation during steady-state. Compared to known output structures, the output structure 300 provides a high ratio between transient current drive capability and steady-state current consumption; therefore, the output structure is appropriate as an output stage for a low-power amplifier. The output structure 300 provides reduced response times for both small signal disturbances and large signal disturbances while preserving low-power operation during steady-state.

The output structure 300 provides positive current boost. Positive current boost means that the output structure 300 advantageously avoids a slew rate limitation of some known output structures, which may occur during a rising output transition. A falling output transition is still limited by the minimum zero tail current, i.e., the output transition is subject to the slew rate limitation. The output structure 300 avoids a speed reduction that occurs in some known output structures because of a slew rate limitation commonly present in known output structures for rising large signal disturbances. The output structure 300 avoids such speed reduction by implementing a positive current boost of the tail current of the differential pair 306. In the output structure 300, the dynamic control of the bias current provides a positive current boost for high-speed large-signal response while not affecting steady-state power consumption. The output structure 300 can be used as an output structure of a voltage regulator (not shown), wherein there is a need to provide a current source but there is no need to provide a current sink.

The output structure 300 includes an amplification stage 301 and a current minor 303. The amplification stage 301 comprises a differential pair 306 with a tail current controlled by an inner feedback loop 307 that provides negative feedback. The inner feedback loop 307 is completely internal to the amplification stage 301. The inner feedback loop 307 has a gain of one. The differential pair 306 comprises an input transistor 302 and an input transistor 304. Input transistors 302 and 304 operate in saturation. The output structure 300 has an inverting input terminal 322, a non-inverting input terminal 324 and an output terminal 326. In one embodiment, the output structure 300 is disposed on an integrated circuit 305.

In one application, the output structure 300 is an output stage of an amplifier 800 (see FIG. 8), and the output structure operates as a buffer between other stages 801 of the amplifier and a circuit 810 being driven by the amplifier. A gate of input transistor 304 provides the non-inverting input terminal 322 of the differential pair 306, and a gate of input transistor 302 provides the inverting input terminal 324 of the differential pair. In such one application, the other stages 801 of the amplifier 800 have a single-ended output terminal that is coupled to the non-inverting input terminal 324 of the output structure 300. As illustrated in FIG. 3, the output terminal 326 of the output structure 300 is connected to the inverting input terminal 322 of the output structure, and the output structure operates as a buffer when it is configured in this way. When the output structure 300 is configured in this way, the output structure includes an outer feedback loop 309 created by coupling the output terminal 326 to the inverting input terminal 322 of the output structure 300. Although FIG. 3 shows the outer feedback loop 309 as a simple direct conductor, this is only one embodiment of the outer feedback loop. In other embodiments, the outer feedback look 309 is accomplished differently. For example, the outer feedback loop 309 could be a resistor divider to control gain, or it could consist of yet other feedback means. The outer feedback loop 309 extends beyond the amplification stage 301, but is completely internal to the amplifier 800. When the output structure 300 operates as a buffer, $V_{OUT}$ is equal to the signal $V_{INP}$ received at the non-inverting input terminal 324 of the output structure. However, to maintain $V_{OUT}=V_{INP}$ during large signal transitions, $I_{OUT}$ may need to increase for a short duration. An amount by which $I_{OUT}$ may need to increase is dependent on the capacitance $C_{LOAD}$ of the input impedance 360 of the circuit 810 being driven by the amplifier. In one embodiment, the gain of the outer feedback loop 309 is "1000".

The inner feedback loop 307 is much faster than the outer feedback loop 309. By "faster" it is meant that the inner feedback loop 307 attains equilibrium more quickly than does the outer feedback loop 309. A speed of the inner feedback loop 307 depends upon a time constant $\tau_1$ of a sub-circuit comprising capacitor 311 and resistor 313. When there is a disturbance, such as an increase in capacitance of the input impedance 360, at the output terminal 326 of the output structure 300, the inner feedback loop 307 instantaneously (with respect to the outer feedback loop 309) maintains $I_{BIAS}$ (and hence a constant $V_{GS}$) through input transistor 302. Therefore, when analyzing operation of the outer feedback loop 309, it can be assumed that the drain current of input transistor 302 is always $I_{BIAS}$, that $V_{GS}$ of input transistor 302 is always equal to a value that produces $I_{BIAS}$, and that $V_{GS}$ of input transistor 304 is equal to this value plus a difference $V_{INP}-V_{INM}$ (input signal). The changes in $V_{OUT}$ depend upon a time constant $\tau_2$ of the load. The time constant $\tau_2$ of the load is much larger, i.e., slower, than $\tau_1$ because the capacitance of the input impedance 360 is typically much larger than the capacitance of capacitor 311. The outer feedback loop 309 does attempt to change the $V_{GS}$ of input transistor 302, but the inner feedback loop 307 reacts much faster than the outer feedback loop 309, and as a result, the $V_{GS}$ of input transistor 302 is controlled by the inner feedback loop 307.

In another embodiment (not shown), the output of the output structure 300 is not connected to the non-inverting input terminal 322 of the output structure, and, in such embodiment, the output structure operates as an amplifier.

PMOS transistor 312 acts as a current source and generates a fixed current $I_{312}$. PMOS transistor 314 acts as a cascode transistor. PMOS transistors 312 and 314 implement, by current folding, the current mirror 110 shown in FIG. 1. PMOS transistors 312 and 314 have their gate voltages biased by similar PMOS devices (not shown) subject to constant currents.

Input transistor 302 requires a certain amount of drain current, which is defined as $I_{BIAS}$, for proper operation during steady-state conditions, i.e., when $V_{INM}=V_{INP}$. In one embodiment, as $I_{BIAS}=1$ µA. The fixed current $I_{312}$ generated by PMOS transistor 312 larger than the bias current $I_{BIAS}$. In one embodiment, the fixed current $I_{312}$ generated by PMOS transistor 312 is approximately $2I_{BIAS}$. The extra amount of current above $I_{BIAS}$ that is generated by PMOS transistor 312 flows through PMOS transistor 314, i.e., $I_{314}=I_{312}-I_{BIAS}$. In the one embodiment where $I_{312}=2I_{BIAS}$, the current generated by PMOS transistor 318 is equal in magnitude to $I_{BIAS}$.

NMOS transistor 318 acts as a current source and generates a fixed current $I_{318}$. NMOS transistor 316 acts as a cascode transistor. In the one embodiment where $I_{312}=I_{BIAS}$, $I_{318}=I_{BIAS}$. NMOS transistors 316 and 318 together represent the current source $I_{BIAS}$ shown in FIG. 1. A difference between a current through PMOS transistor 312 and a current through NMOS transistor 318 flows through a drain of input transistor 302, i.e., $I_{302}=I_{312}-I_{318}$ in steady-state. NMOS transistors 316 and 318 their gate voltages biased by similar NMOS devices (not shown) subject to constant currents.

When a value of $V_{INM}$ falls, thereby causing the drain current of input transistor 302 to become less than $I_{BIAS}$, the inner feedback loop 307 increases a tail current of the differential pair 306 accordingly, thereby decreasing a voltage of node 325 and decreasing $V_{DS}$ of input transistor 302. The inner feedback loop 307 increases the tail current of the differential pair 306 until the previous $V_{GS}$, i.e., the value of $V_{GS}$ before the fall of $V_{INM}$, of input transistor 302 returns. As a result, the drain current of input transistor 302 instantaneously (with respect to the response time of the output structure 300) returns to $I_{BIAS}$ and is maintained at $I_{BIAS}$.

Conversely, when a value of $V_{INM}$ rises, thereby causing the drain current of input transistor 302 to become greater than $I_{BIAS}$, the inner feedback loop 307 decreases a tail current of the differential pair 306 accordingly, thereby increasing a voltage of node 325 and increasing $V_{DS}$ of input transistor 302. The inner feedback loop 307 decreases the tail current of the differential pair 306 until the previous $V_{GS}$, i.e., before the rise of $V_{INM}$, of input transistor 302 returns. As a result, the drain current of input transistor 302 instantaneously (with respect to the response time of the output structure 300) returns to $I_{BIAS}$ and is maintained at $I_{BIAS}$.

The tail current $I_{TAIL}$ is generated by an NMOS tail transistor 320 having a drain coupled to the source of the input transistor 304 and to the source of the input transistor 302, having a source coupled to $V_{SS}$, and having a gate coupled to a node 330. The current amplifier 120 shown in FIG. 1 is implemented in FIG. 3 by the NMOS tail transistor 320 alone. It should be appreciated that the NMOS tail transistor 320 acts as the tail current boosting circuitry in conjunction with the other elements of the amplification stage 301.

The tail current $I_{TAIL}$ is equal to a sum of currents through input transistors 302 and 304. When $V_{INP}=V_{INM}$, the current through input transistor 302 is equal to $I_{BIAS}$ and the current through input transistor 304 is equal to $I_{304}$. Under this condition, a ratio between currents $I_{304}$ and $I_{BIAS}$ is determined by a ratio between dimensions of input transistors 302 and 304. In one embodiment, input transistor 302 and 304 have equal dimensions such that $I_{304}=I_{BIAS}$ when $V_{INP}=V_{INM}$.

The current mirror 303 transforms a drain current $I_{304}$ of input transistor 304 into a useful output current $I_{OUT}$ that can charge the capacitance $C_{LOAD}$ of the input impedance 360 of the circuit 810 being driven by the output structure 300. The amplification stage 301 can vary the voltage on $C_{LOAD}$. The amplification stage 301 can vary the voltage on $C_{LOAD}$ between $V_{DD}$ and $V_{SS}$.

The values of capacitor 311 and resistor 313 are adjusted to accomplish frequency compensation of the inner feedback loop 307 and the outer feedback loop 309 of the output structure 300.

In the output structure 300, a gate of NMOS tail transistor 320 is driven by a voltage of the node 330, which voltage is a result of amplification by the inner feedback loop 307. The voltage of the node 330 swings as much as needed to cause NMOS tail transistor 320 to conduct a large tail current $I_{TAIL}$ needed when reacting to large input voltage differences. For example, an incremental increase of the voltage $V_{INM}$ at the gate of input transistor 302 is converted by the transconductance of input transistor 302, $g_{m302}$, to an incremental increase of a current through the drain of input transistor 302. This incremental increase of current does not flow through PMOS transistor 312 because PMOS transistor 312 acts as a current source which keeps the current constant. Instead, this incremental increase of current flows through PMOS transistor 314 and is pulled from charge stored in capacitance at the node 330, which is primarily a gate-to-source capacitance of NMOS transistor 330 in parallel with a capacitance of capacitor 311. The node 330 is a high impedance node because the transistor 318 keeps the current through it constant, and because the gate of NMOS tail transistor 320 has high impedance for low frequencies. The voltage $V_{130}$ of the node 330 is an amplified version of the voltage $V_{INM}$ at the gate of input transistor 302. $V_{130}=-V_{INM} \times g_{m302} \times Z_{330}$, where $Z_{330}$ is impedance of node 330. At each occasion that the input voltage $V_{INM}$ falls, the gate voltage of NMOS tail transistor 320 rises, thereby increasing $I_{TAIL}$, and $I_{TAIL}$ may increase to any amount limited by safe operation of the circuit. Conversely, at each occasion that the input voltage $V_{INM}$ rises, the gate voltage of NMOS tail transistor 320 falls, thereby decreasing $I_{TAIL}$, and $I_{TAIL}$ may decrease to zero but may not become negative.

The tail current boosting circuitry provides an amount of tail current $I_{TAIL}$ that is equal to $2I_{BIAS}$ when $V_{INP}$ at the non-inverting input terminal 324 is equal to $V_{INM}$ at the inverting input terminal 322, and provides an amount of tail current $I_{TAIL}$ that is advantageously greater than $2I_{BIAS}$ when $V_{INP}$ is greater than $V_{INM}$.

Advantageously, NMOS tail transistor 320 provides such tail current regardless of whether it is operating in the saturation region or in the triode region. The inner feedback loop 307 accounts for the region of operation of the NMOS tail transistor 320 such that the output current $I_{OUT}$ is not affected by the region of operation of the NMOS tail transistor.

The inner feedback loop 307 compensates for the region of operation, e.g., saturation or triode, of NMOS tail transistor 320. The inner feedback loop 307 dynamically adjusts the gate voltage of NMOS tail transistor 320 to produce a desired tail current boost. If NMOS tail transistor 320 enters triode region, the inner feedback loop 307 increases the gate voltage to achieve a same boost in tail current as when the NMOS tail transistor operates in saturation, i.e., the desired current boosting behavior is achieved regardless of the region of operation of the NMOS tail transistor. This means that the current boosting capability of the output structure 300 is maintained even when the drain-to-source voltage of NMOS tail transistor 320 is only slightly above 0V, which leaves maximum voltage headroom for the common-mode input level (common-mode voltage at the gate of the input transistors 302 and 304). Any current boosting feature that the known output structures have significantly degrades as the transistor that sinks the tail current enters the triode region. Therefore, the known output structures disadvantageously limit the common-mode input level to a narrower range compared to the output structure 300. When $V_{INP}=V_{INM}$, a current defined as $I_{BIAS}$ goes through the drain of input transistor 302 and the drain of input transistor 304 of the differential pair 306. The inner feedback loop 307 adjusts the gate voltage of NMOS tail transistor 320 such that the input transistor 302 conducts one $I_{BIAS}$. The inner feedback loop 307 adjusts the tail current such that the drain current of the input transistor 302 is always $I_{BIAS}$. If there is a voltage disturbance (away from $V_{INP}=V_{INM}$) at the gate of input transistor 302, then the drain current of the input transistor 302 would tend to change (away from $I_{BIAS}$) for the duration of the disturbance, if it were not for the presence of the inner feedback loop 307. However, the change in drain current of the input transistor 302 changes the voltage of the node 330, such that the tail current changes by an amount needed to return to equilibrium, which is $I_{BIAS}$ going through input transistor 302. By now, it should be appreciated that the phrase "dynamically biased" means that the output structure 300 maintains the bias current of input transistor 302 at a value equal to a value that occurs when $V_{INP}=V_{INM}$ in spite of $V_{INP}$ being much greater than $V_{INM}$.

To have an unchanged drain current through input transistor 302 for any value of $V_{INM}$, $V_{GS}$ of input transistor 302 should remain unchanged. In other words, $V_{INM}$ minus the source voltage of input transistor 302 should remain unchanged. If $V_{INM}$ decreases, then the inner feedback loop 307 decreases the source voltage of input transistor 302 so that $V_{GS}$ of input transistor 302 remains unchanged.

Whenever $V_{INM}$ at the gate voltage of input transistor 302 decreases, the drain current of input transistor 302 tends to decrease (to a value below $I_{BIAS}$). This means that more current flows into node 330, which makes the voltage of node 330 rise (i.e., the charge on the capacitance of node 330 increases). This causes $I_{TAIL}$ to increase which causes the drain voltage of NMOS tail transistor 320 and the source voltage of input transistor 302 to decrease by a same amount that the voltage at the gate of input transistor 302 decreased. If there is a decrease in $V_{INM}$, the inner feedback loop 307 causes the voltage of node 325 to decrease by a same amount, so that $V_{GS}$ and therefore a drain current of input transistor 302, are maintained unchanged. During a time that the load of the output structure 300 is sinking a large current (due to a large transient voltage in a positive direction at input terminal 324 of the output structure), the voltage of node 330 remains higher than its steady-state voltage. After a resulting large transient at the output terminal 326 of the output structure 300 finishes, the outer feedback loop 309 causes the voltage of the node 330 to drop to its steady-state voltage. The value of the steady-state voltage of the node 330 depends on a size of NMOS tail transistor 320.

When the gate voltage ($V_{INM}$) of input transistor 302 goes down by a $\Delta$ amount, the feedback causes voltage of the common source node of input transistors 302 and 304 to fall by a same Δ amount. However, if the gate voltage ($V_{INP}$) of input transistor 304 does not also fall, then $V_{GS}$ of input transistor 304 increases by the same Δ amount. Therefore, a voltage difference $V_{INP}$–$V_{INM}$ is applied as a change in $V_{GS}$ of input transistor 304, and the drain current of input transistor 304 rises in a transconductance relationship to the change in $V_{GS}$.

If $V_{INP}$ decreases, then $V_{GS}$ of input transistor 304 decreases (because the inner feedback loop 307 is maintaining node 325 at a fixed voltage). When $V_{INP}$ decreases, the drain current of input transistor 304 falls until $V_{GS}$ decreases to a voltage such that input transistor 304 is cutoff.

A description of the circuitry of the current minor 303 is as follows. $I_{OUT}$ is a mirror of the drain current of input transistor 304. The current minor 303 of the output structure 300 advantageously allows $V_{INP}$ to rise to $V_{DD}$ without adversely affecting the gain of the output structure 300. As a result, the current minor 303 allows for rail-to-rail transitions of $V_{INP}$, as long as $V_{INP}$ is greater than or equal to an NMOS threshold voltage of input transistor 304. The current mirror 303 comprises a PMOS transistor 341 having a source coupled to $V_{DD}$ and a drain coupled to a source of a PMOS transistor 342. PMOS transistors 341 and 342 are coupled together such that they create a small loop. A drain of PMOS transistor 342 is coupled to a first current source comprising NMOS transistors 347 and 348. The current mirror 303 also comprises a PMOS transistor 353 having a gate coupled to the gate of PMOS transistor 341, a source coupled to $V_{DD}$ and a drain coupled to a second current source comprising NMOS transistors 354 and 356. The small feedback loop adjusts the drain voltage of PMOS transistor 342 (and the gate voltage of PMOS transistor 341) so that PMOS transistor 341 conducts the current through input transistor 304 plus the current through PMOS transistor 342. When the output structure 300 is in equilibrium, or steady-state, PMOS transistor 341 conducts the current that flows through input transistor 304 plus the current that flows through PMOS transistor 342. When the output structure 300 is in equilibrium, PMOS transistor 342 conducts the current that flows through NMOS transistors 347 and 348. NMOS transistors 347, 348, 354 and 356 are biased (not shown) such that they behave as constant current sources.

Due to the operation of the current minor 303, the drain voltage of input transistor 304 does not go lower than $V_{INP}$ minus the NMOS threshold voltage. Therefore, input transistor 304 does not go into the triode region. The drain voltage of input transistor 304 is equal to $V_{DD}$–$V_{DS}$ of PMOS transistor 341, where $V_{DS}$ of PMOS transistor 341 can be made to be less than one NMOS threshold voltage. As long as $V_{DS}$ of PMOS transistor 341 is less than the NMOS threshold voltage, the input transistor 304 does not go into the triode region in spite of $V_{INP}$=$V_{DD}$. The current minor 303 allows the gate voltage of input transistor 304 to rise to values up to and including $V_{DD}$ and still allow input transistor 304 to operate in saturation.

As the drain current of input transistor 304 increases, the drain voltage of PMOS transistor 341 decreases which causes $V_{SG}$ of PMOS transistor 342 to decrease. PMOS transistor 342 has a common-gate configuration, i.e., its gate is coupled a fixed voltage. Therefore, when the source voltage of PMOS transistor 342 decreases, its drain voltage also decreases and does so in an amplified fashion due to the gain of PMOS transistor 342. Because of feedback by the small loop, the gate voltage of PMOS transistor 341 also decreases to a voltage equal to the drain voltage of PMOS transistor 342. As a result, PMOS transistor 341 provides additional current and eventually achieves a new equilibrium state wherein PMOS transistor 341 provides the increased drain current of input transistor 304 (in addition to the source current for PMOS transistor 342).

A current through PMOS transistor 353 is a same amount as the current through PMOS transistor 341, provided that they have equal sizes. A current $I_{OUT}$ at the output of the output structure 300 is the current through PMOS transistor 353 minus a current sunk by the NMOS transistors 354 and 356. If PMOS transistors 341 and 353 constitute a 1:1 current mirror, then the current sunk by NMOS transistors 354 and 356 is the same amount as the current sunk by NMOS transistors 347 and 348. In some embodiments, PMOS transistors 341 and 353 constitute a 1:n current minor, where n>1. In embodiments where PMOS transistors 341 and 353 constitute a 1:n current mirror, the current sunk by NMOS transistors 354 and 356 is n times the amount as the current sunk by NMOS transistors 347 and 348. In one embodiment, PMOS transistors 341 and 353 constitute a 1:5 current mirror, and the current through NMOS transistor 347 and 348 is 1 μA, and the current through NMOS transistor 354 and 356 is 5 μA.

In another embodiment (not shown), a simple current minor could be used instead of the current mirror 303. However, a simple current mirror does not allow the output structure 300 to operate properly when $V_{INP}$ rises to values near $V_{DD}$. In such other embodiment, the highest allowable value of $V_{INP}$ is the drain voltage of input transistor 304 plus the NMOS threshold voltage, or typically about $V_{DD}$–400 mV. If $V_{INP}$ were to become higher than the highest allowable value, then input transistor 304 would enter the triode region and the gain of the output structure 300 would be adversely affected.

Figure 4:
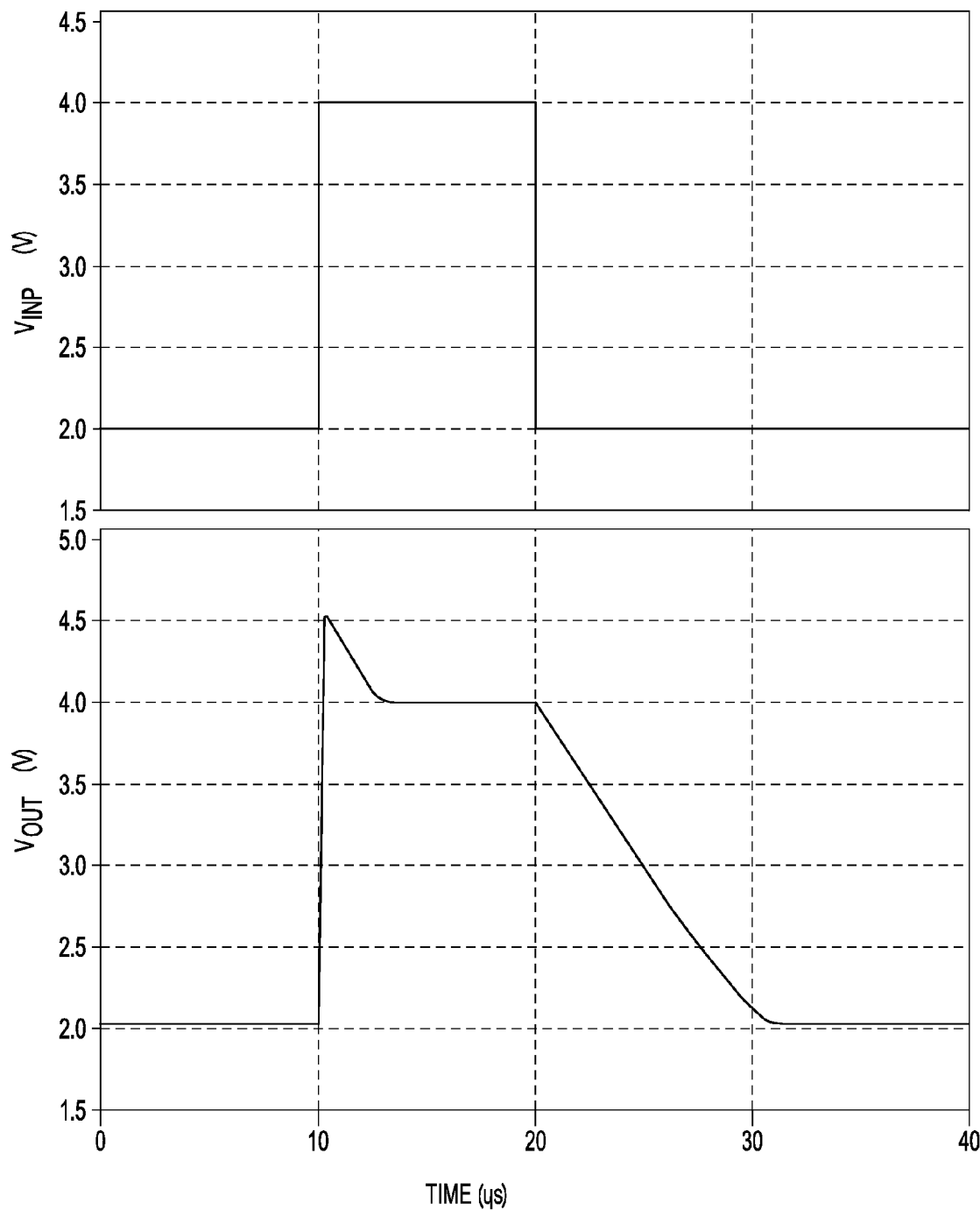
FIG. 4 illustrates graphs of one of the input signals and a graph of an output signal of the dynamically biased output structure shown in FIG. 3.

FIG. 4 illustrates graphs of the input signal $V_{INP}$ and the output signal $V_{OUT}$ of the output structure 300 versus time. The graphs of FIG. 4 are the results of a simulation of the output structure 300 with $V_{DD}$=5V and $V_{SS}$=0V. A purpose of the output structure 300 is to drive a high capacitance $C_{LOAD}$ with a large current when needed without having to consume such large current continuously. The output structure 300 consumes such large current only when it drives the high capacitance $C_{LOAD}$ with the large current. The output structure 300 advantageously does not consume such large current prior to driving the high capacitance $C_{LOAD}$ in a positive direction, i.e., to a higher voltage. FIG. 4 illustrates that the output structure 300 is able to source a large amount of current (in one embodiment, 1 mA) as it drives the high capacitance $C_{LOAD}$ in a positive direction, i.e., to a higher voltage. As a result, the output structure 300 is able to increase $V_{OUT}$ from 2V to about 4.5V almost instantaneously, as shown in FIG. 4. The output structure 300 is only able to sink a few microamperes (in the same one embodiment, 5 μA) as it drives the high capacitance $C_{LOAD}$ in a negative direction, i.e., to a lower voltage, as shown in FIG. 4. This is the reason that the output structure 300 takes as much as 10 μs to reduce $V_{OUT}$ from 4V to about 2V, as shown in FIG. 4. However, this limitation in driving the high capacitance $C_{LOAD}$ in a negative direction is overcome by the output structure 500.

In the graph of FIG. 4, the rise of the output voltage (from 2V to about 4.5V) is much faster than the falls (from about 4.5V to 4.0V and from 4.0V to 2V). This is because the output structure 300 provides an output current boost in one direction only, the positive direction, and because the falls are limited by slew rate. A drain current of NMOS transistor 304 can become much higher than the fixed current sources of the output structure 300, so the charging of $C_{LOAD}$ is faster. In the other direction, there is no current boost, and the drain current of NMOS transistor 304 can only be lowered to zero. Therefore, a current that is discharging $C_{LOAD}$ is eventually limited to the fixed current sources. Although small signal analysis suggests a fast response, a large-signal peak current is clamped to limits of the fixed current sources, and, therefore, the response time becomes much higher, i.e., slower.

Figure 5:
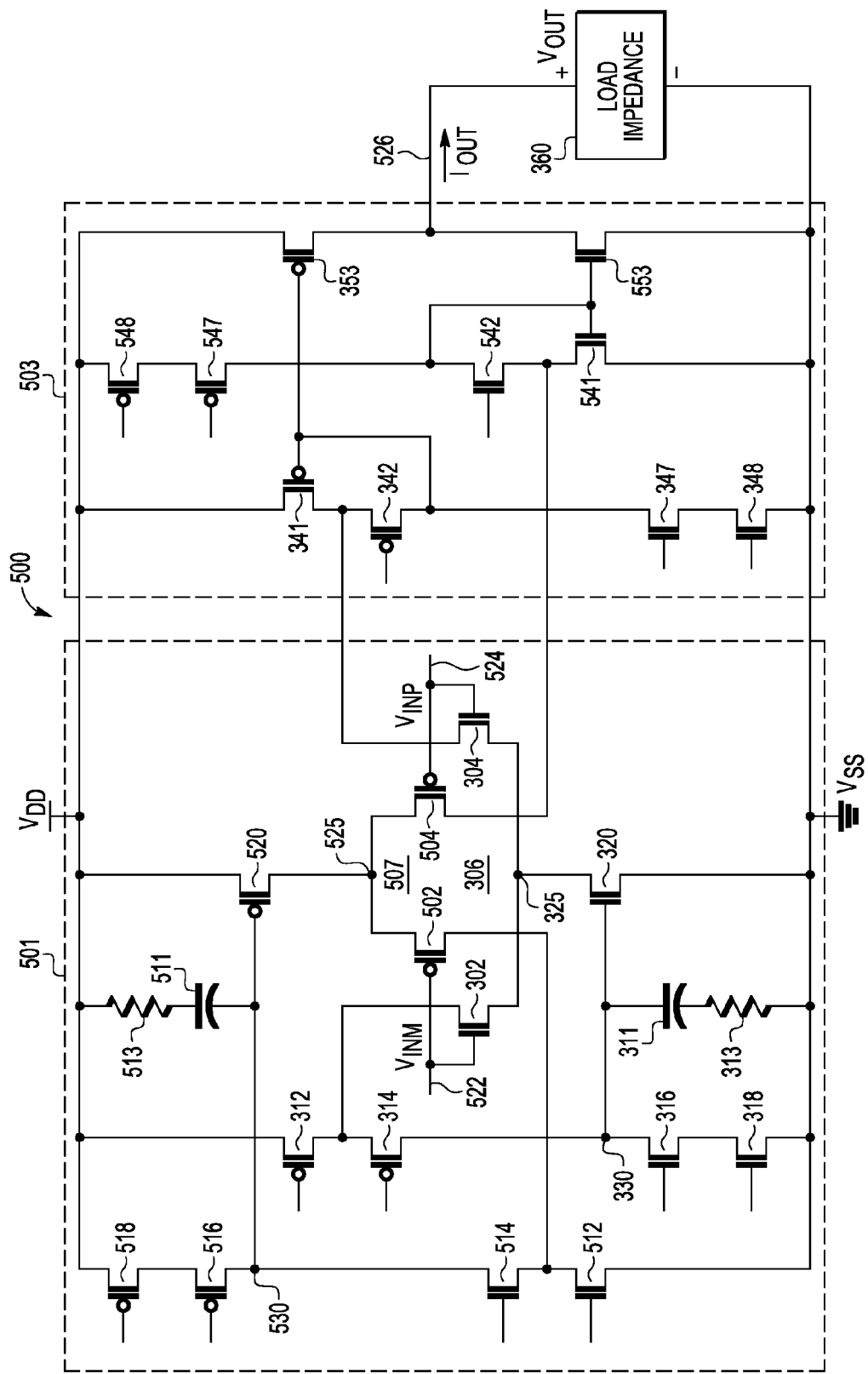
FIG. 5 is a schematic of another dynamically biased output structure in accordance with another embodiment of the invention, and an input impedance of a circuit that may be driven by the dynamically biased output structure.

FIG. 5 is a schematic of the dynamically biased output structure 500 in accordance with another embodiment of the invention, and an input impedance 360 of a circuit that may be driven by the biased output structure. The output structure 500 can be used as an amplifier wherein there is a need to provide both a current source and a current sink. The output structure 500 includes the output structure 300, which is an N implementation, combined with a P implementation of a same type of circuit. In other words, the P implementation portion of FIG. 5 is a reciprocal of the output structure 300. In the output structure 500, the N implementation portion provide positive current boost and the P implementation portion provides negative current boost.

The output structure 500 is a symmetrical PN embodiment that provides bi-directional current boost capability while supporting rail-to-rail output excursions with high-speed large-signal response. The output structure 500 avoids any slew rate limitation by dynamically controlling the biasing current of P and N differential pairs. The output structure 500 includes an amplification stage 501 and a current minor 503. The amplification stage 501 comprises an NMOS differential pair 306 and a PMOS differential pair 507.

The following is a description of the P implementation of the output circuit 500. The differential pair 507 comprises an input transistor 302 and an input transistor 304. Input transistors 502 and 504 operate in saturation. The output structure 500 has an inverting input terminal 522, a non-inverting input terminal 524 and an output terminal 526.

NMOS transistor 512 acts as a current source and generates a fixed current $I_{512}$. NMOS transistor 514 acts as a cascode transistor. NMOS transistors 512 and 514 implement, by current folding, the current mirror 110 shown in FIG. 1. Input transistor 502 requires a certain amount of drain current, which is defined as $I_{BIAS}$, for proper operation during steady-state conditions, i.e., when $V_{INM}=V_{INP}$. In one embodiment, as $I_{BIAS}=1$ μA. The fixed current $I_{512}$ generated by NMOS transistor 512 larger than the bias current $I_{BIAS}$. In one embodiment, the fixed current $I_{512}$ generated by NMOS transistor 512 is approximately $2I_{BIAS}$. The extra amount of current above $I_{BIAS}$ that is generated by NMOS transistor 512 flows through NMOS transistor 514, i.e., $I_{514}=I_{512}-I_{BIAS}$. PMOS transistor 518 acts as a current source and generates a fixed current $I_{518}$. PMOS transistor 516 acts as a cascode transistor. A difference between a current through NMOS transistor 512 and a current through PMOS transistor 518 flows through a drain of input transistor 502, i.e., $I_{502}=I_{512}-I_{518}$.

When a value of $V_{INM}$ rises, thereby causing the source current of input transistor 502 to become less than $I_{BIAS}$, an inner feedback loop (not indicated in FIG. 5) increases a tail current of the differential pair 507 accordingly, thereby increasing a voltage of node 525 and increasing $V_{DS}$ of input transistor 502. The inner feedback loop increases the tail current of the differential pair 507 until the previous $V_{GS}$, i.e., the value of $V_{GS}$ before the fall of $V_{INM}$, of input transistor 502 returns. As a result, the source current of input transistor 502 instantaneously (with respect to the response time of the output structure 500) returns to $I_{BIAS}$ and is maintained at $I_{BIAS}$.

$I_{OUT}$ is a mirror of the drain current of input transistor 304 minus a minor of the drain current of input transistor 504. The current mirror 503 of the output structure 500 advantageously allows $V_{INP}$ to rise to $V_{DD}$ or fall to $V_{SS}$ without adversely affecting the gain of the output structure 500. As a result, the current mirror 503 allows for rail-to-rail transitions of $V_{INP}$. The current mirror 503 comprises an NMOS transistor 541 having a source terminal coupled to $V_{SS}$ and a drain terminal coupled to a source terminal of an NMOS transistor 542. NMOS transistors 541 and 542 are coupled together such that they create a small loop. A drain of PMOS transistor 542 is coupled to a first current source comprising PMOS transistors 547 and 548. The current mirror 503 also comprises an NMOS transistor 553 having a gate coupled to the gate of NMOS transistor 541, a drain coupled to $V_{SS}$ and a source coupled to a second current source comprising PMOS transistors 554 and 556. The small feedback loop adjusts the drain voltage of NMOS transistor 542 (and the gate voltage of NMOS transistor 541) so that NMOS transistor 541 conducts the current through input transistor 504 plus the current through NMOS transistor 542. When the output structure 500 is in equilibrium, or steady-state, NMOS transistor 541 conducts the current that flows through input transistor 504 plus the current that flows through NMOS transistor 542. When the output structure 500 is in equilibrium, NMOS transistor 542 conducts the current that flows through PMOS transistors 547 and 548. PMOS transistors 547, 548, 554 and 556 are biased (not shown) in a manner so that they operate as current sources.

The limitation, stated earlier, that current mirror 303 (an N implementation) allows for rail-to-rail transitions of $V_{INP}$ only when $V_{INP}$ is greater than or equal to an NMOS threshold voltage of input transistor 304, does not adversely affect operation of the output structure 500. This is because the P implementation portion of output structure 500 covers the N implementation portion when $V_{INP}$ is less than the NMOS threshold voltage of input transistor 304, and because the N implementation portion covers the P implementation portion when $V_r$ is close to $V_{DD}$.

Because the operation of the P implementation portion of the output structure 500 is essentially the reciprocal of the operation of the N implementation portion of the output structure 500 (which closely resembles the output structure 300), the operation of the P implementation portion of the output structure 500 will not be described in further detail.

The output structure 500 is able to provide both a source and a sink of current for $C_{LOAD}$. In the output structure 500, a maximum value that the output current can attain is advantageously greater than the bias current (limited only by safe operation of the output structure), and a minimum value that the output current can attain is advantageously less than zero (limited only by safe operation of the output structure).

In general, when charging/discharging a capacitance, $I=CdV/dt$. Therefore, the maximum "speed" $dV/dt$ is limited by a maximum current being applied. Without some current boost techniques, a rate $dV_{OUT}/dt$ is limited by some internal current source $I_{SRC}$, i.e., $\max(dV_{OUT}/dt)=I_{SRC}/C_{LOAD}$. The output structure 500 provides a much higher $dV_{OUT}/dt$ because the current that charges/discharges the capacitance $C_{LOD}$ can become much higher than any of the fixed current sources. With the output structure 500, the speed achieved for small signal transients is also achieved for large signal transients because the internal current peaks are not clamped to any maximum current limits.

The amount by which the maximum $dV_{OUT}/dt$ limit is increased can be understood by applying the following technique:

gain in $dV/dt=(\max\_cb(dV_{OUT}/dt)/\max\_sr(dV_{OUT}/dt))=\max(I_{BOOST})/I_{SRC}$, where $\max\_sr(dV_{OUT}/dt)=I_{SRC}/C_{LOAD}$ with slew rate limitation, and max_cb($dV_{OUT}/dt$)=max($I_{BOOST}$)/$C_{LOAD}$ with the current boost technique in accordance with the invention.

A typical value for the gain in dV/dt is "1000".

The output structure 500 maintains a small signal bandwidth, i.e., a small signal speed, for larger signal transients because the maximum rate of output voltage variation over time ($dV_{OUT}/dt$) is not limited by some maximum current provided by an internal fixed current source (a common cause of the slew rate limitation in known output structures). Instead, the current that charges/discharges the capacitance $C_{LOAD}$ may become much larger than any current being provided by internal fixed current sources. This significantly widens the magnitude of signal disturbances to which the output structure 500 may respond without speed reduction caused by the slew rate limitation.

In the embodiment illustrated in FIG. 5, the output structure 500 is configured as a class AB amplifier, in that the output terminal 526 is not coupled to the inverting input terminal 522. In another embodiment (not shown), the output structure 500 is configured as a buffer, in that the output terminal 526 is coupled to the inverting input terminal 522.

The output structure 500 can be used as an output stage of an amplifier that may include one or more other stages.

The output structure 500 can be used for driving an input terminal of an analog-to-digital converter.

Figure 6:
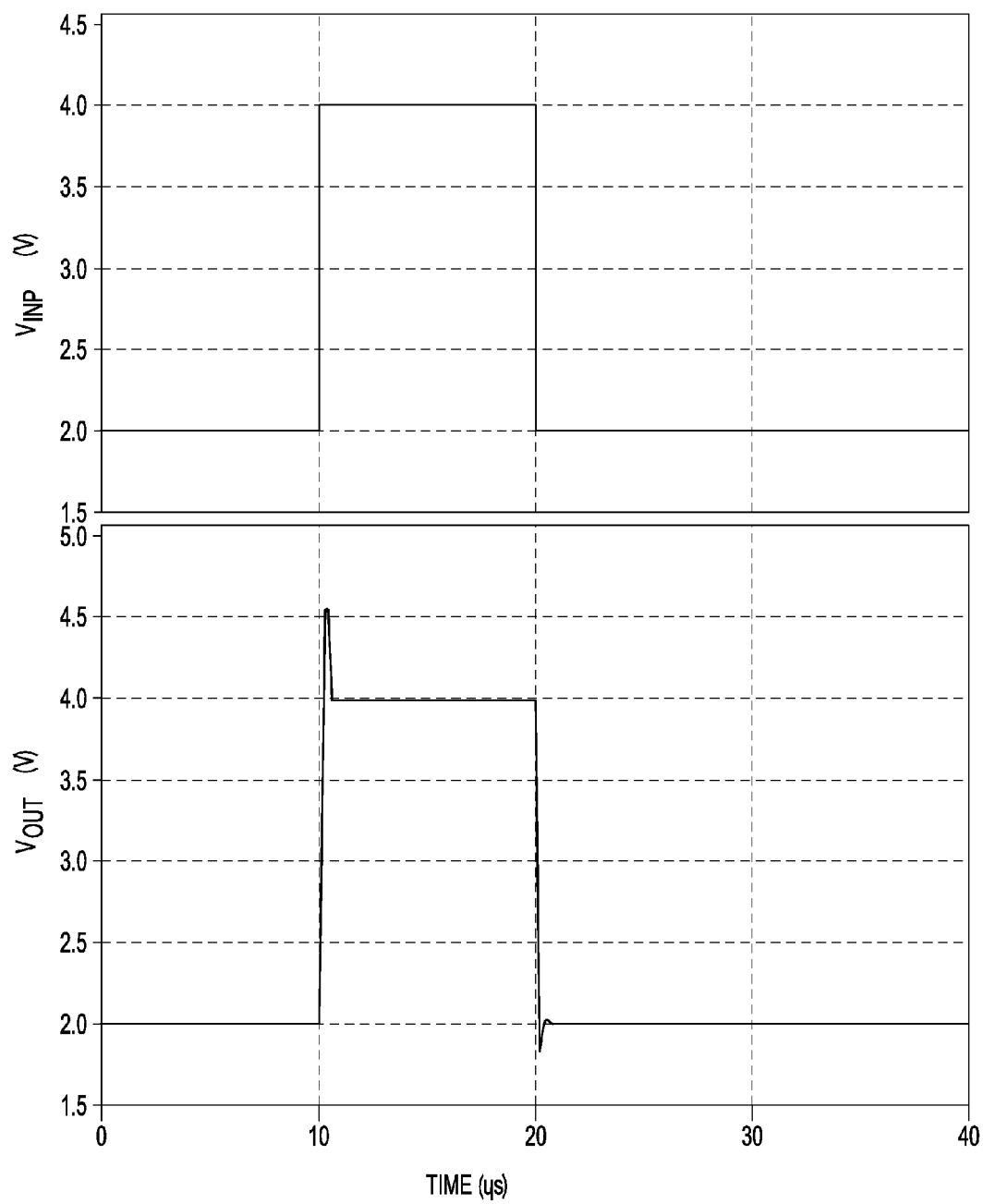
FIG. 6 illustrates graphs of one of the input signals and a graph of an output signal of the dynamically biased output structure shown in FIG. 5.

FIG. 6 illustrates graphs of the input signal $V_{INP}$ and a graph of voltage of the output signal $V_{OUT}$ of the output structure 500 versus time. The graphs of FIG. 6 are the results of a simulation of the output structure 500 with $V_{DD}$=5V and $V_{SS}$=0V. FIG. 6 illustrates that he output structure 500 is able to increase $V_{OUT}$ from 2V to about 4.5V almost instantaneously, and that output structure 500 is able to decrease $V_{OUT}$ from 4V to 2V almost instantaneously. The graphs of FIG. 6 illustrate that the output structure 500 provides current boost in both directions, and that the rise and the fall of the output voltage of the output structure 500 are advantageously not limited by slew rate as in known output structures.

Figure 7:
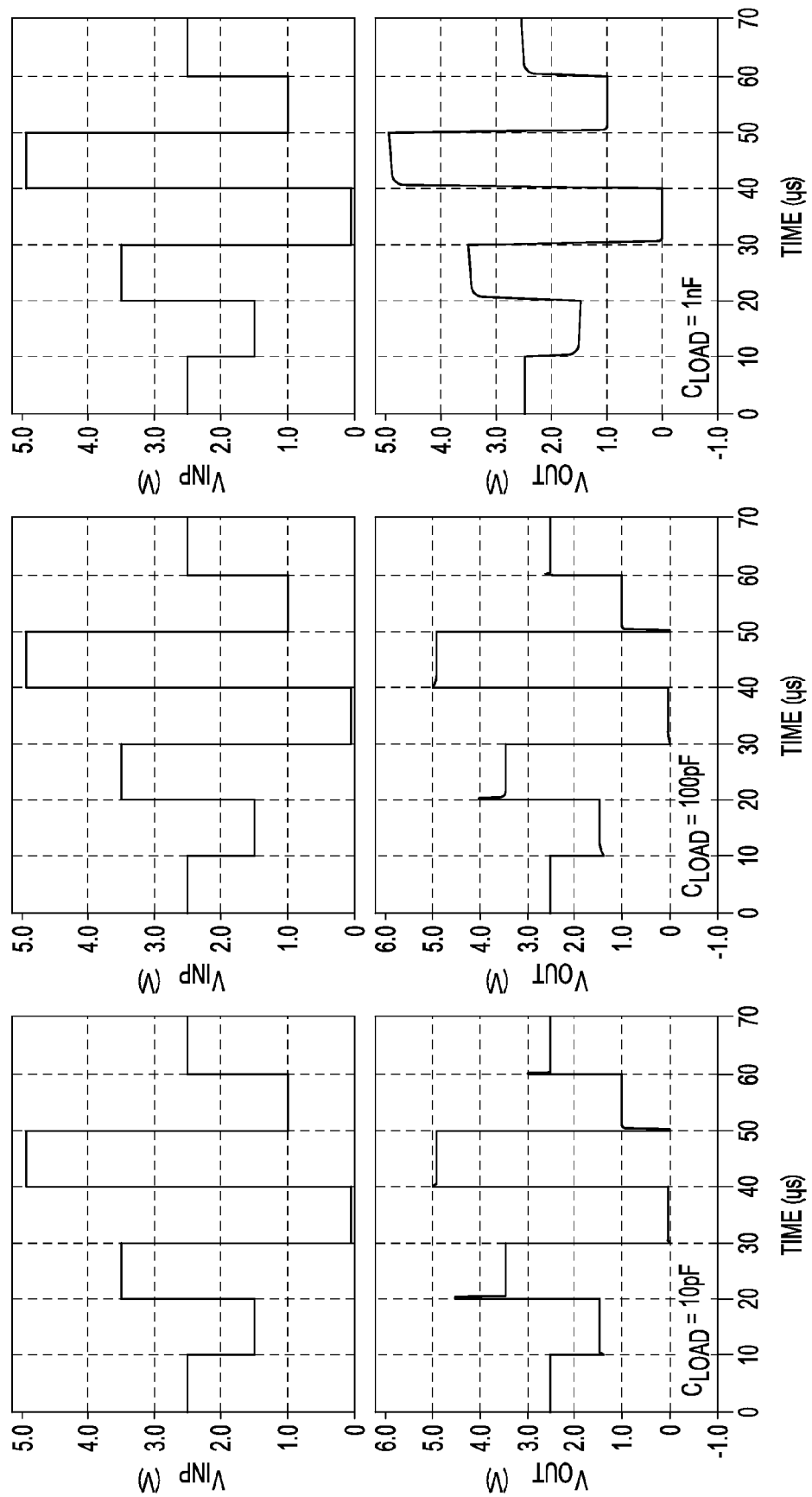
FIG. 7 illustrates graphs of output signals of the output structure shown on FIG. 5 for each of three high-capacitive loads in response to various large-signal rail-to-rail input transitions.

FIG. 7 illustrates graphs of the voltage of the output signal $V_{OUT}$ versus time of the output structure 500 for each of three high-capacitive loads for various cases of large-signal, rail-to-rail input transitions. FIG. 7 shows an input signal and output signals resulting from a simulation of the output structure 500 with $V_{DD}$=5V and $V_{SS}$=0V. An input signal that changes every 10 µs shown. Also shown are output signals when $C_{LOAD}$=10 pF, 100 pF and 1 nF. Ideally, the output signal should be a perfect copy of the input signal. The output structure advantageously maintains similar response times (bandwidth) for a wide range of $C_{LOAD}$ values (in one embodiment, from 10 pF to 1000 pF). The graphs show that the output signal stabilizes almost as well when the $C_{LOAD}$=1 nF as when $C_{LOAD}$=10 pF. This is able to happen because the reaction time of the output current is not limited by the slew rate of the transistors of the differential pair. The output waveforms do not deteriorate by an amount that an increase in $C_{LOAD}$ by a factor of ten would be expected to cause with a known class AB amplifier.

Figure 8:
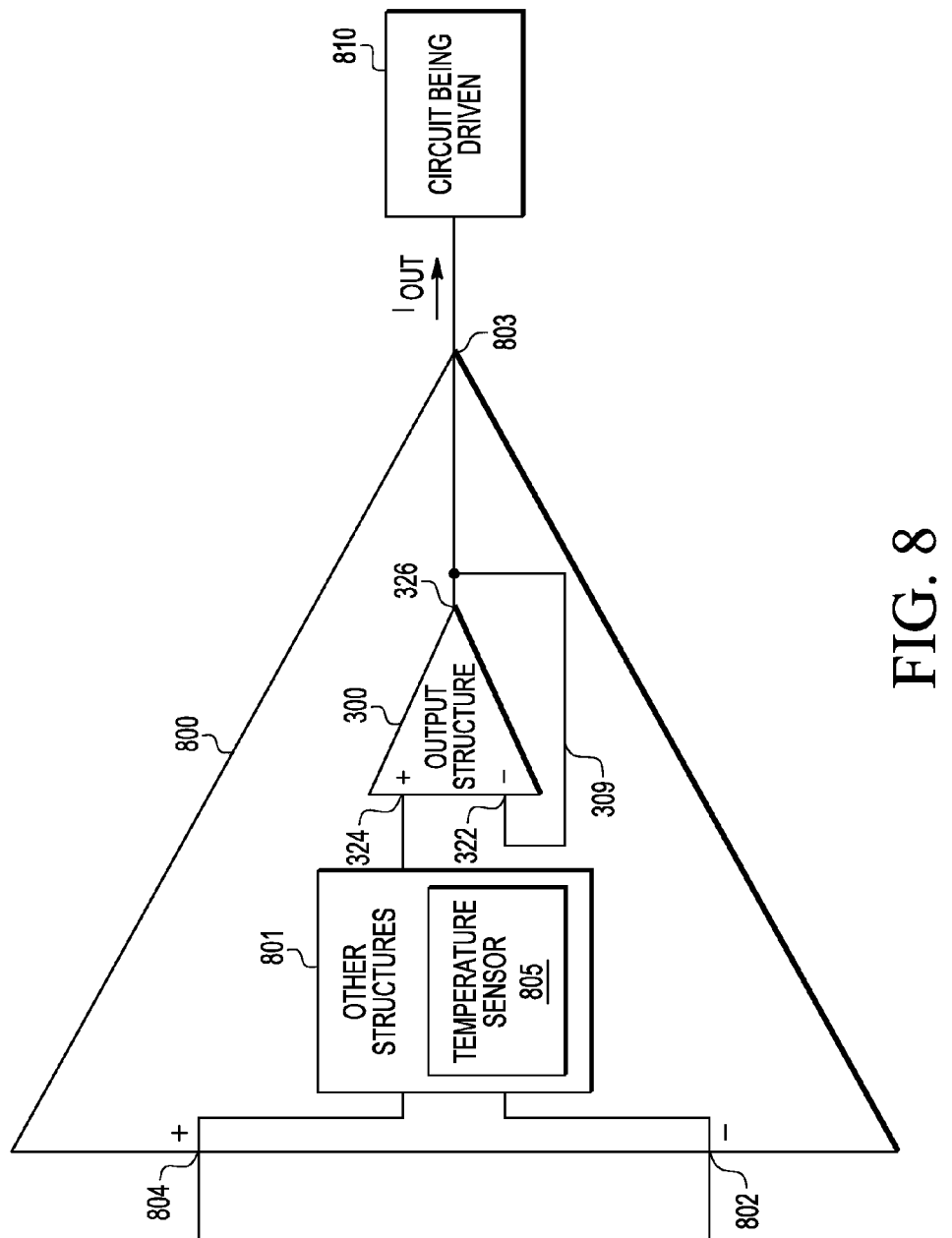
FIG. 8 is a schematic of one embodiment of an amplifier that includes the dynamically biased output structure, and a block diagram of a circuit that may be driven by the amplifier.

FIG. 8 is a schematic of one embodiment of an amplifier 800 and a block diagram of a circuit 810 that may be driven by the amplifier. In one embodiment, the amplifier 800 is an operational amplifier. The amplifier 800 includes the output structure 300 which is communicatively coupled to other structures 801. The other structures 801 may include an input structure, or input stage. The amplifier 800 includes an inverting input terminal 802, a non-inverting input terminal 804, and an output terminal 803. The other structures 801 receive signals from the non-inverting input terminal 804 and the inverting input terminal 802 of the amplifier 800, and the other structures 801 output a single-ended signal to the non-inverting input terminal 324 of the output structure 300. The output terminal 326 of the output structure 300 outputs a single-ended signal through the output terminal 803 of the amplifier 800. The circuit 810 that may be driven by the amplifier 800 is communicatively coupled to the output terminal 803 of the amplifier. The circuit 810 that may be driven by the amplifier 800 includes an input impedance such as input impedance 360 shown in FIG. 3. In another embodiment (not shown), the amplifier 800 includes the output structure 500 instead of the output structure 300. In one embodiment, the other structures 801 include a temperature sensor 805, and in such embodiment, the amplifier 800 lacks the inverting input terminal 802 and the non-inverting input terminal 804 because the input of the amplifier comes from the environment. One example of the temperature sensor 805 is described in U.S. Pat. No. 8,378,735 B2, entitled DIE TEMPERATURE SENSOR CIRCUIT, issued Feb. 19, 2014 to Pereira da Silva, Jr., et al., and assigned to the assignee of the present invention. In such one embodiment, a voltage $V_{INP}$ that the othernstructure 801 provides to the input terminal 324 of the output structure 300 is an analog signal indicative of temperature of the amplifier 800. One example of the circuit 810 that may be driven by the amplifier 800 is an analog-to-digital converter for converting the analog signal indicative of temperature to a digital signal indicative of temperature.

In the general, a typical use of the output structure 300 and 500 depends on the nature of the load, and more specifically on a current range that is required for the load. If the current range is ideally unbounded in both directions, then output structure 500 is appropriate. If the current range for the load has a lower (or upper) bound near zero or at some small negative (or positive) value, then output structure 300 (or a P reciprocal of output structure 300) is appropriate. If there is no need to swing the output signal rapidly in both directions, then the output structure 300 may be more advantageous because it is smaller than the output structure 500.

The output structure 300 and 500 has no intermediate stage between the inputs and the amplification stage 301 and 501; therefore, the output structure has a lower offset error. The output structures 300 and 500 needs fewer current sources/branches than known output structures, which allow for lower power consumption, and provide a single-ended output.

The output structure 300 and 500 which has a response time, uses current sources having magnitudes that are advantageously smaller than a magnitude of a tail current generator of known output structures which have a same response time but which disadvantageously also have large slew rate limitations.

In some known output structures, a maximum value that a tail current of a differential pair can attain is the bias current, and a minimum value that the tail current can attain is zero. On the other hand, in the output structure 300 and 500, a maximum value that the tail current $I_{TAIL}$ can attain is advantageously greater than the bias current $I_{BIAS}$ (limited only by safe operation of the output structure), and a minimum value that the tail current $I_{TAIL}$ can attain is zero.

Some known class AB amplifiers have three or more branches that carry larger current when reacting to large signal disturbances. One known output structure accomplishes dynamic bias control by adjusting the tail current using feedback that attempts to maintain a constant current through one of the transistors of the differential pair. However, this known output structure has a disadvantageously large number of branches between $V_{DD}$ and $V_{SS}$ each of which conducts high current during transients. This known output structure also has a larger number of devices that conduct each of these high currents and such devices need to be sized accordingly, which results in high power consumption and large area usage. On the other hand, the output structure 300 advantageously has only two branches that carry the larger current when reacting to large signal disturbances, thereby reducing power consumption of the output structure 300 compared to known output structures.

In one known class AB amplifier, a transistor that provides a tail current for a voltage differential pair mirrors a current in a diode-connected transistor, and, to do so, the transistor that provides the tail current must be operating in saturation region. When the common-mode voltage of an input signal drops, the transistor that provides the tail current enters a triode region, and the transistor no longer mirrors the current in the diode-connected transistor. As a result, the transistor that provides the tail current will no longer be able to provide any tail current extension, and, as a result, the output current may be distorted. In contrast to such one known class AB amplifier, the inner feedback loop 307 of the output structure 300 compensates for the region of operation, e.g., saturation or triode, of NMOS tail transistor 320.

In another known class AB amplifier, a minimum voltage that must be applied to inputs of a differential pair is a gate-to-source voltage of the differential pair plus saturation voltage of a transistor that provides a tail current, i.e., $V_{GS}+V_{SAT}$, where $V_{SAT}$ is typically about 400 mV. On the other hand, for the output structure 300, the minimum voltage that must be applied to the inputs of the differential pair 306 is advantageously merely the gate-to-source voltage of the transistors of the differential pair 306. For example, for the output structure 300, even if the drain of NMOS tail transistor 320 drops to near 0V, the NMOS tail transistor will still be able to provide tail current expansion.

It is possible that a transient input signal could cause NMOS tail transistor 320 to turn off. To avoid input transistors 302 and 304 from turning off, another embodiment (not shown) of the output structure 300 includes a fixed current source in parallel with the NMOS tail transistor 320. Such other embodiment of the output structure 300 imposes a minimum bias current.

In one embodiment, the output structure 300 and 500 is disposed on an integrated circuit 305 fabricated using a complementary metal oxide semiconductor (CMOS) process. Although the output structure 300 and 500 is disposed on an integrated circuit 305 fabricated using CMOS technology, in one exemplary embodiment, the output structure can also be disposed on an integrated circuit fabricated using other technologies.

Although the invention is described herein with reference to specific embodiments, various modifications and changes can be made without departing from the scope of the present invention as set forth in the claims below. For instance, although the exemplary embodiments show that the output structure 300 and 500 is disposed on an integrated circuit, the invention is equally usable when constructed entirely of components consisting of discrete devices. Although one embodiment of the output structure 300 and 500 may comprise FETs, another embodiment of the output structure 300 and 500 may comprise bipolar junction transistors.

Although the invention has been described with respect to specific conductivity types or polarity of potentials, skilled artisans appreciated that conductivity types and polarities of potentials may be reversed.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below.

What is claimed is:

1. An integrated circuit including a transconductance amplification stage, the transconductance amplification stage comprising:
　a differential pair of transistors, wherein a first input terminal of the amplification stage includes a control electrode of a first transistor of the differential pair, wherein a second input terminal of the amplification stage includes a control electrode of a second transistor of the differential pair, and wherein a current equal to a bias current flows through a conducting electrode of the first transistor and through a conducting electrode of the second transistor when a first input voltage at the first input terminal is equal to a second input voltage at the second input terminal;
　first circuitry, coupled to the conducting electrode of the first transistor and to a node, for providing a first current;
　second circuitry, coupled to the node, for sinking a second current from the node, wherein the second current is equal to the first current minus the bias current;
　tail current boosting circuitry, coupled to the node, for providing a translinear expansion of tail current of the differential pair, the tail current responsive to a voltage at the node;
　a feedback loop that dynamically biases the differential pair by controlling the voltage at the node by negative feedback during operation,
　wherein the current through the conducting electrode of the second transistor is maintained at a constant value during operation, and
　wherein a conducting electrode of the first transistor provides an output current responsive to a difference between the first input voltage and the second input voltage; and
　an output terminal for outputting the output current.

2. The integrated circuit of claim 1, wherein the current through the conducting electrode of the second transistor remains, during operation, at the value of the bias current regardless of the difference between the first input voltage and the second input voltage.

3. The integrated circuit of claim 2, wherein the feedback loop maintains the current through the conducting electrode of the second transistor constant by adjusting the voltage at the node.

4. The integrated circuit of claim 3, wherein the tail current boosting circuitry provides an amount of tail current equal to two times the bias current when the first input voltage at the first input terminal is equal to the second input voltage at the second input terminal, and provides a tail current greater than two times the bias current when the first input voltage at the first input terminal is greater than the second input voltage at the second input terminal.

5. The integrated circuit of claim 3, wherein the tail current boosting circuitry provides an amount of tail current that is representative of a difference between first input voltage at the first input terminal and the second input voltage at the second input terminal.

6. The integrated circuit of claim 1, wherein the tail current boosting circuitry is coupled to a second conducting electrode of the first transistor and to a second conducting electrode of the second transistor.

7. The integrated circuit of claim 6, wherein the tail current boosting circuitry includes a tail transistor having a conducting electrode coupled to the second conducting electrode of the first transistor and to the second conducting electrode of the second transistor, having a second conducting electrode coupled to a power supply terminal, and having a control electrode coupled to the node.

8. The integrated circuit of claim 7, wherein the current through the conducting electrode of the first transistor is not affected by a region of operation of the tail transistor of the tail current boosting circuitry.

9. The integrated circuit of claim 7, wherein the feedback loop compensates for a region of operation of the tail transistor of the tail current boosting circuitry.

10. The integrated circuit of claim 1, wherein the first current is a fixed current having a magnitude equal to two times the bias current, and wherein the second current is a fixed current having a magnitude equal to the bias current.

11. The integrated circuit of claim 1, wherein the second current is a fixed current that has, at all times when operating, a magnitude equal to a magnitude of current of the conducting electrode of the second transistor that occurs when the first input voltage at the first input terminal is equal to the second input voltage at the second input terminal.

12. An integrated circuit including a dynamically biased output structure of an amplifier, the dynamically biased output structure having a non-inverting input terminal for receiving a first input voltage, an inverting input terminal for receiving a second input voltage, and an output terminal for outputting an output voltage, comprising:
a transconductance amplification stage, including:
a differential pair of transistors, wherein a first input terminal of the amplification stage includes a control electrode of a first transistor of the differential pair, wherein a second input terminal of the amplification stage includes a control electrode of a second transistor of the differential pair, and wherein a current equal to a bias current flows through a conducting electrode of the first transistor and through a conducting electrode of the second transistor when a first input voltage at the first input terminal is equal to a second input voltage at the second input terminal,
first circuitry, coupled to the conducting electrode of the first transistor and to a node, for providing a first current,
second circuitry, coupled to the node, for sinking a second current from the node, wherein the second current is equal to the first current minus the bias current during operation,
tail current boosting circuitry, coupled to the node, for providing a translinear expansion of tail current of the differential pair, the tail current responsive to a voltage at the node, and
a feedback loop that dynamically biases the differential pair by controlling the voltage at the node by negative feedback,
wherein the current through the conducting electrode of the second transistor is maintained at a constant value, and wherein a conducting electrode of the first transistor provides a current responsive to a difference between the first input voltage and the second input voltage; and
a current mirror, coupled to the transconductance amplification stage, for providing an output current at the output terminal of the output structure, wherein the output current is equal in magnitude to the current of the first conducting electrode of the second transistor.

13. The integrated circuit of claim 12, wherein the tail current boosting circuitry includes a tail transistor, wherein the feedback loop compensates for a region of operation of the tail transistor by controlling a voltage at a control electrode of the tail transistor, and wherein the current through the conducting electrode of the first transistor is not affected by a region of operation of the tail transistor.

14. The integrated circuit of claim 12, wherein the output voltage at the output terminal of the output structure is representative of a difference between the first input voltage and the second input voltage.

15. The integrated circuit of claim 12, including
an outer feedback loop that couples the output terminal of the output structure to the inverting input terminal of the amplification stage,
wherein the output voltage at the output terminal of the output structure is equal to the first input voltage at the non-inverting input terminal.

16. The integrated circuit of claim 15, wherein the output terminal of the output structure is coupled to a load impedance, and the tail current dynamically changes in response to changes in the output voltage.

17. The integrated circuit of claim 15, wherein the output terminal of the output structure is coupled to a load impedance, and the output current dynamically changes in response to changes in the output voltage.

18. The integrated circuit of claim 15, wherein the output terminal of the output structure is coupled to a load impedance, and wherein the output voltage remains representative of the first input voltage during large-signal, rail-to-rail input transitions of the first input voltage.

19. An amplifier having at least an output terminal, comprising:
output circuitry having at least one input terminal for receiving an input voltage, and an output terminal coupled to the output terminal of the amplifier for outputting an output voltage, the output circuitry comprising:
a transconductance amplification stage, including:
a differential pair of transistors, wherein a first input terminal of the amplification stage includes a control electrode of a first transistor of the differential pair, wherein a second input terminal of the amplification stage includes a control electrode of a second transistor of the differential pair,
first circuitry, coupled to a conducting electrode of the first transistor and to a node, for providing a first current,
second circuitry, coupled to the node, for sinking a second current from the node, wherein the second current is equal to the first current minus a bias current of the differential pair during operation,
tail current boosting circuitry, coupled to the node, for providing a translinear expansion of a tail current of the differential pair, the tail current responsive to a voltage at the node; and a feedback loop that dynamically biases the differential pair by controlling the voltage at the node by negative feedback, wherein a current through a conducting electrode of the second transistor is maintained at a constant value, and wherein a conducting electrode of the first transistor provides a current responsive to a difference between a voltage at the first input terminal and a voltage at the second input terminal; and a current mirror, coupled to the transconductance amplification stage, for providing an output current at the output terminal of the output circuitry, wherein the output current has a magnitude that is equal to or greater than a magnitude of the current through the first conducting electrode of the second transistor; and other circuitry for providing the input voltage to the input terminal of the output circuitry, wherein the output circuitry acts as a buffer between the other circuitry and the output terminal of the amplifier.

20. The amplifier of claim 19, wherein the other circuitry include a temperature sensor, and wherein the input voltage is an analog signal indicative of temperature of the amplifier.

* * * * *